US009235610B2

(12) United States Patent
Conron et al.

(10) Patent No.: US 9,235,610 B2
(45) Date of Patent: Jan. 12, 2016

(54) SHORT STRING COMPRESSION

(71) Applicant: THOMSON REUTERS GLOBAL RESOURCES, Baar (CH)

(72) Inventors: Joseph P. Conron, Sayville, NY (US); Saul M. Nadata, Norfolk, NY (US)

(73) Assignee: Thomson Reuters Global Resources, Baar (CH)

( * ) Notice: Subject to any disclaimer, the term of this patent is extended or adjusted under 35 U.S.C. 154(b) by 410 days.

(21) Appl. No.: 13/867,199

(22) Filed: Apr. 22, 2013

(65) Prior Publication Data

US 2013/0318093 A1     Nov. 28, 2013

Related U.S. Application Data

(60) Provisional application No. 61/650,637, filed on May 23, 2012.

(51) Int. Cl.
  *H03M 7/30*       (2006.01)
  *G06F 17/30*      (2006.01)

(52) U.S. Cl.
  CPC ........... *G06F 17/30312* (2013.01); *H03M 7/30* (2013.01); *H03M 7/3059* (2013.01); *H03M 7/3084* (2013.01)

(58) Field of Classification Search
  CPC ... H03M 7/3084; H03M 7/3059; H03M 7/30; G06F 17/30312
  USPC ............................................ 341/87, 106, 107
  See application file for complete search history.

(56) References Cited

U.S. PATENT DOCUMENTS

| 4,761,761 | A   |   | 8/1988  | Sekicuchi |         |
|-----------|-----|---|---------|-----------|---------|
| 6,196,466 | B1  |   | 3/2001  | Schuessler |        |
| 6,570,511 | B1  | * | 5/2003  | Cooper    | 341/59  |
| 6,603,414 | B1  | * | 8/2003  | Postas    | 341/87  |
| 7,327,293 | B2  | * | 2/2008  | Foster    | 341/103 |
| 8,063,800 | B2  | * | 11/2011 | Schuessler | 341/90 |

OTHER PUBLICATIONS

International Search Report and Written Opinion issued Jul. 10, 2013 in the related PCT application PCT/US13/37550.

* cited by examiner

*Primary Examiner* — Brian Young
(74) *Attorney, Agent, or Firm* — Bartholomew J. DiVita; Jeanpierre J. Giuliano; Katy Chan-Parsons

(57) ABSTRACT

Systems and techniques are disclosed to express sequences of codes, and in particular sequences of ASCII characters, in a lossless compressed format. The techniques may include dividing a universe of expressible codes into smaller subsets, called code sets, such that every code exists within one code set, but no code exists within two code sets. The code sets are then utilized for compression based on the heuristic that it is more likely that a next code in the sequences of codes is in the same code set as a previous code in the sequences of codes, rather than that the next code in sequences of codes being in any other code set (sentence structure).

16 Claims, 9 Drawing Sheets

Example Code Sets

76A→(0) Upper case letters plus some symbols (31 codes): ABCDEFGHIJKLMNOPQRSTUVWXYZ-/:@_
76B→(1) Lower case letters (26 codes): abcdefghijklmnopqrstuvwxyz
76C→(2) Most symbols (27 codes): !#$%^&*()=+[{]}|\;'"'<,>?~` and the space character (' ')
76D→(3) Numbers, and the single dot character (11 codes): 0123456789 and the dot '.' character

FIG. 4

| Code set signaler length in bits | Code length in bits | Minimum number of sequential codes to express in one multiple-code subsequence, instead of several one-code subsequences |
|---|---|---|
| 1 | 1 | 2 (5 bits instead of 6 bits) |
| 1 | 2 | 3 (10 bits instead of 12 bits) |
| 1 | 3 | 3 (14 bits instead of 15 bits) |
| 1 | 4 | 4 (22 bits instead of 24 bits) |
| 1 | 5 | 4 (27 bits instead of 28 bits) |
| 1 | 6 | 5 (38 bits instead of 40 bits) |
| 2 | 1 | 2 (6 bits instead of 8 bits) |
| 2 | 2 | 2 (9 bits instead of 10 bits) |
| 2 | 3 | 3 (15 bits instead of 18 bits) |
| 2 | 4 | 3 (19 bits instead of 21 bits) |
| 2 | 5 | 3 (23 bits instead of 24 bits) |
| 2 | 6 | 4 (33 bits instead of 36 bits) |

| Number of sequential codes in the same code set | Expression as a series of single-code subsequences | Expression as one multiple-code subsequence | Worksheet for the multiple code |
|---|---|---|---|
| 1 | 7 bits | 11 bits | 1-bit signaler, 2-bit code set, 4-bit code, 4-bit terminator |
| 2 | 14 bits | 15 bits | 1-bit signaler, 2-bit code set, 4-bit code, 4-bit code, 4-bit terminator |
| 3 | 21 bits | 19 bits | 1-bit signaler, 2-bit code set, 4-bit code, 4-bit code, 4-bit code, 4-bit terminator |

| Number of sequential codes in the same code set | Expression as a series of single-code subsequences | Expression as one multiple-code subsequence | Worksheet for the multiple code |
|---|---|---|---|
| 1 | 8 bits | 13 bits | 1-bit signaler, 2-bit code set, 5-bit code, 5-bit terminator |
| 2 | 16 bits | 18 bits | 1-bit signaler, 2-bit code set, 5-bit code, 5-bit code, 5-bit terminator |
| 3 | 24 bits | 23 bits | 1-bit signaler, 2-bit code set, 5-bit code, 5-bit code, 5-bit code, 5-bit terminator |

GBP/CHF##227GBPCHF1S (20 characters) consists of the following subsequences code set 0 (7 codes "GBP/CHF", 43 bits) ~ 102A code set 2 (2 codes "##", 16 bits, signaled as two one-code sets) ~ 102B code set 3 (3 codes "227", 19 bits) ~ 102C code set 0 (6 codes "GBPCHF", 38 bits) ~ 102D code set 0 (1 code "1", 7 bits) ~ 102E code set 3 (1 code "S", 8 bits) ~ 102F

FIG. 8

UBSFEED@_^_18300188629360002120113094556091-A1_^_ (49 characters) consists of the following subsequences:

code set 0 (8 codes "UBSFEED@", 48 bits) ~ 104A code set 2 (3 codes "_^_", 23 bits) ~ 104B code set 3 (32 codes "18300188629360002120113094556091", 135 bits) ~ 104C code set 0 (2 codes "-A", 16 bits, signaled as two one-code sets) ~ 104D code set 3 (1 codes "1", 7 bits) ~ 104E code set 2 (3 codes "_^_", 23 bits) ~ 104F

FIG. 9

SHORT STRING COMPRESSION

CROSS-REFERENCE TO RELATED APPLICATIONS

This application claims priority to U.S. Provisional Application 61/650,637 filed on May 23, 2012, the content of which is incorporated herein in its entirety.

TECHNICAL FIELD

This disclosure relates to compression techniques, and more particularly to systems and methods for encoding and decoding short sequences of characters.

BACKGROUND

Today, much of computer science involves the storage and transmission of sequences of short codes. Example short codes include, but are not limited to, the file and directory names used by operating systems, chat conversations having very short statements, and website URL's defined by a single short sequence of characters within a limited character universe.

For purposes of both storage and transmission, it is advantageous to represent these and other short codes in as few bytes (indeed, bits) as possible. A typical uncompressed encoding of printable ASCII codes uses 8-bits (or 1 byte) per code. Many of today's encoding schemes may use more than 1 byte per code, as they can represent a universe of codes greater in size than two-hundred and fifty-six (256), which is the largest number of discrete codes which can be represented using binary in eight (8) bits.

Many of today's compression algorithms identify patterns in the codes they read, and then exploit the identified patterns by creating a dynamic dictionary that is used to express subsequent occurrences of the patterns in the codes more compactly. This approach, while useful for long sequences, provides limited value for the shorter sequences of codes that dominate computer science. Most lossless data compression algorithms, such as the Lempel-Ziv ('LZ') compression methods and their many variants, yield poor results when used with short code sequences. The results are considered poor because the encoded output contains more bits than were present in the original sequence, resulting in expansion, not compression, of the short code sequences.

Accordingly, there exists a need to have a simple, quick-to-execute, lossless method of encoding and decoding short sequences of information.

SUMMARY

Systems and techniques are disclosed to express sequences of codes, and in particular sequences of ASCII characters, in a lossless compressed format. The techniques may include dividing a universe of expressible codes into smaller subsets, called code sets, such that every code exists within one code set, but no code exists within two code sets. The code sets are then utilized for compression based on the heuristic that it is more likely that a next code in the sequences of codes is in the same code set as a previous code in the sequences of codes, rather than that the next code in sequences of codes being in any other code set.

The systems and techniques may be beneficial for very short code sequences for which many industry-standard compression algorithms offer limited compression at significant time cost. As such, the systems and techniques offer improved compression for short sequences meeting certain heuristic patterns with less complexity of expression.

Various aspects of the disclosure relate to associating code subsets with a first code sequence including a set of characters and generating a second code sequence from the set of characters using less storage than the first code sequence.

For example, according to one aspect, a computer-implemented method of encoding a sequence of characters includes accessing, from a computer device, a set of characters conforming to a first format, and associating, at the computer device, one of a plurality of code subsets to each of the set of characters. The method also includes generating, at the computer device, a code sequence representing the set of characters. The generated code sequence conforms to a second format using fewer bits than the first format and includes a first indicator for specifying a single-code sequence or a multi-code sequence, a second indicator for specifying the one of the plurality of code subsets associated with the set of characters, and a third indicator for specifying an index value into the one of the plurality of associated code subsets corresponding to the set of characters.

In one embodiment, the second format further includes a fourth indicator for specifying an end position of the code sequence. The method may also include determining whether to generate the code sequence as a single-code sequence or a multi-code sequence.

A system, as well as articles that include a machine-readable medium storing machine-readable instructions for implementing the various techniques, are disclosed. Details of various implementations are discussed in greater detail below.

The systems and techniques may be beneficial for very short sequences of codes, of the type for which many industry-standard compression techniques offer limited compression at significant time cost. The systems and techniques may also provide improved compression for short code sequences meeting certain heuristic patterns, at a reduced computational cost with less complexity of expression.

Additional features and advantages will be readily apparent from the following detailed description, the accompanying drawings and the claims.

BRIEF DESCRIPTION OF THE DRAWINGS

FIG. 4 illustrates an exemplary set of code subsets.

FIG. 5 illustrates points of efficiency associated with the method shown in FIG. 2.

FIG. 6 illustrates an example worksheet for four (4) bit codes.

FIG. 7 illustrates an example worksheet for five (5) bit codes.

FIG. 8 illustrates a first example of encoding using the method shown in FIG. 2.

FIG. 9 illustrates a second example of encoding using the method shown in FIG. 2.

Like reference symbols in the various drawings indicate like elements.

DETAILED DESCRIPTION

Figure 1:
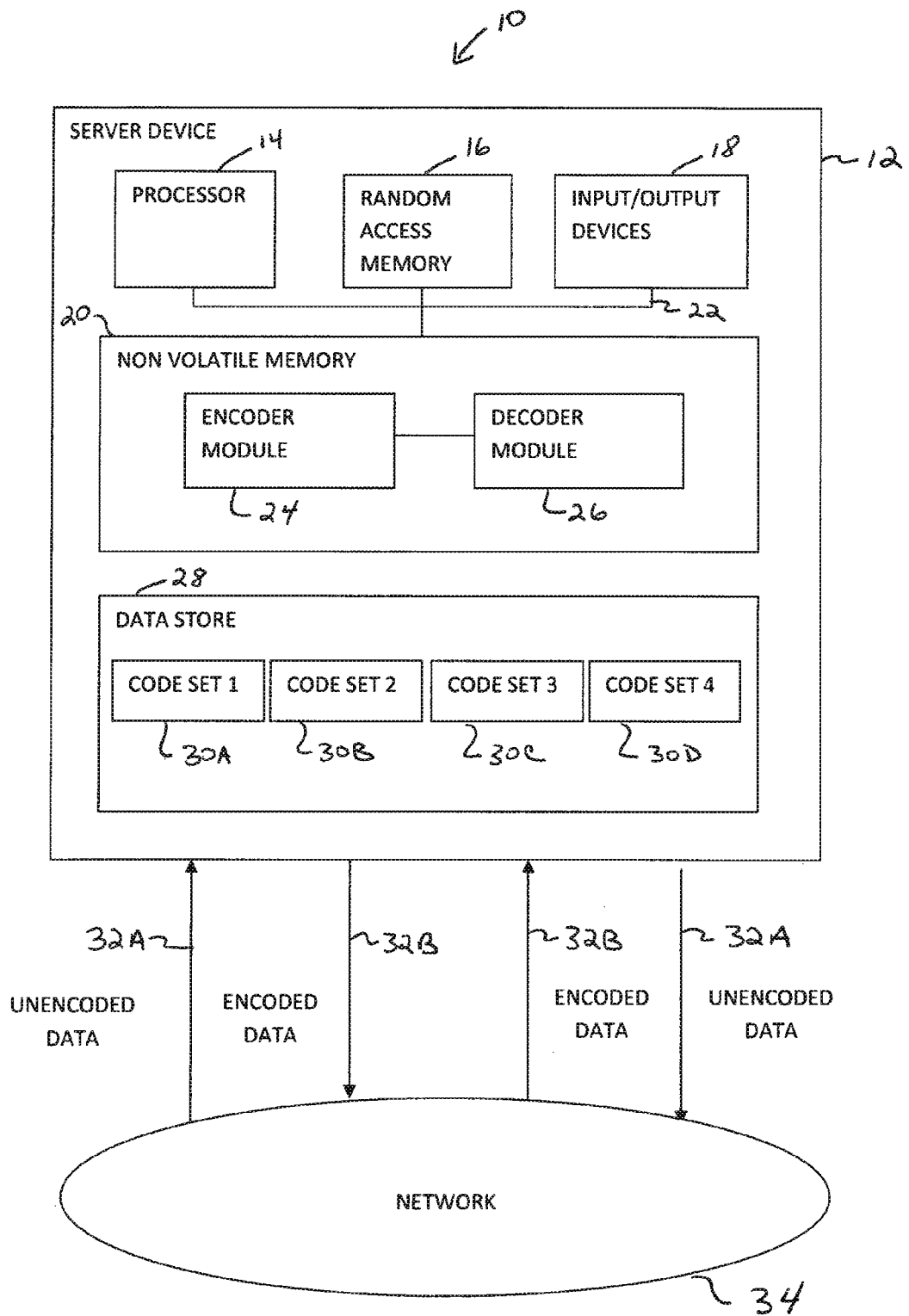
FIG. 1 is a schematic of an exemplary system for encoding and decoding sequences of characters.

FIG. 1 shows a computer-based system 10 for rapid encoding and decoding short sequences of characters. As shown in the FIG. 1 example, the system 10 includes a server device 12 configured to include a processor 14, such as a central processing unit (CPU), random access memory ('RAM') 16, one or more input-output devices 18, such as a display device (not shown) and keyboard (not shown), and non-volatile memory 20, all of which are interconnected via a common bus 22 and controlled by the processor 14. In one embodiment, as shown in FIG. 1, the non-volatile memory 20 is configured to include an encoder module 24 for encoding short sequences of characters, and a decoder module 26 for decoding encoded sequences of characters. Details of the encoder module 24 and decoder module 26 are discussed in greater detail below.

The system 10 may be configured to include an access device (not shown) that is in communication with the server device 12 over a network 34. The access device can include a personal computer, laptop computer, or other type of electronic device, such as a cellular phone or Personal Digital Assistant (PDA). In one embodiment, for example, the access device is coupled to I/O devices (not shown) that include a keyboard in combination with a pointing device such as a mouse for sending requests to the server device 12. Preferably, memory of the access device is configured to include a browser that is used to request and receive information from the server device 12 over the network 34.

The server device 12 includes a data store 28 that includes one or more set of expressible codes. In one embodiment, the one or more set of expressible codes are stored into smaller subsets, illustrated as code sets 30A-D in FIG. 1, such that every code of a universe of codes exists within one code set, but no code exists within two code sets. While four (4) code sets 30A-D are illustrated in FIG. 1, the present disclosure is not limited to four (4) code sets.

The code sets 30A-D may be utilized by the encoder module 24 for compression and by the decoder module 26 for decompression. In one embodiment, the code sets 30A-D are based on the heuristic that it is more likely that a next code in a sequence is in the same code set as the previous code in the sequence, rather than the next code in the sequence being identified in any other code set. Advantageously, this heuristic is true for most expressible data. For example, considering the printable English language, a sentence typically consists of a single capital letter, followed by several lowercase letters. If an English sentence includes a number digit, it is more likely that the next character in the sequence is another number digit rather than another lowercase letter. If the sentence includes an acronym, an upper case letter is more likely to be followed by another upper case letter as compared to a sentence without an acronym.

Accordingly, in one embodiment, the encoder module 24 is configured to divide expressible codes into code sets 30A-D which meet the before-mentioned heuristic, resulting in fewer bits being required to express each code within a code set. The encoder module 24 then stores the code sets 30A-D in the data store 28. An example of four (4) code sets 76A-D with respective codes established by the encoder module 24 is shown in connection with FIG. 4.

The data store 28 shown in FIG. 1 may be any medium suitable for storing electronic data information. For example, in one embodiment, the data store 28 is a relational database. In another embodiment, the document data store 28 is a directory server, such as a Lightweight Directory Access Protocol ('LDAP') server. In yet another embodiment, the data store 28 is a configured area in the non-volatile memory 20 of the device server 12. Although the data store 28 shown in FIG. 1 is part of the server device 12, it will be appreciated by one skilled in the art that the data store 28 may be distributed across various servers and be accessible to the server device 12 via a network 34.

The network 34 can include various devices such as routers, servers, and switching elements connected in an Intranet, Extranet or Internet configuration. In one embodiment, the network 34 uses wired communications to transfer information between the access device and the server device 12. In another embodiment, the network 34 employs wireless communication protocols. In yet other embodiments, the network 34 employs a combination of wired and wireless technologies.

In one embodiment, as shown in FIG. 1, unencoded data 32A (e.g., data represented in any standard data format, such as the American Standard Code for Information Interchange (ASCII) or Extended Binary Coded Decimal Interchange Code (EBCDIC)) and encoded data 32B (e.g., data represented in accordance with an encoding technique described herein) are transmitted to and received from the server device 12 for encoding and decoding, respectively. Exemplary unencoded data includes, but is not limited to, file names, directory names, chat conversations and messages, website Uniform Resource Locators ('URLs'), and metadata.

Figure 2:
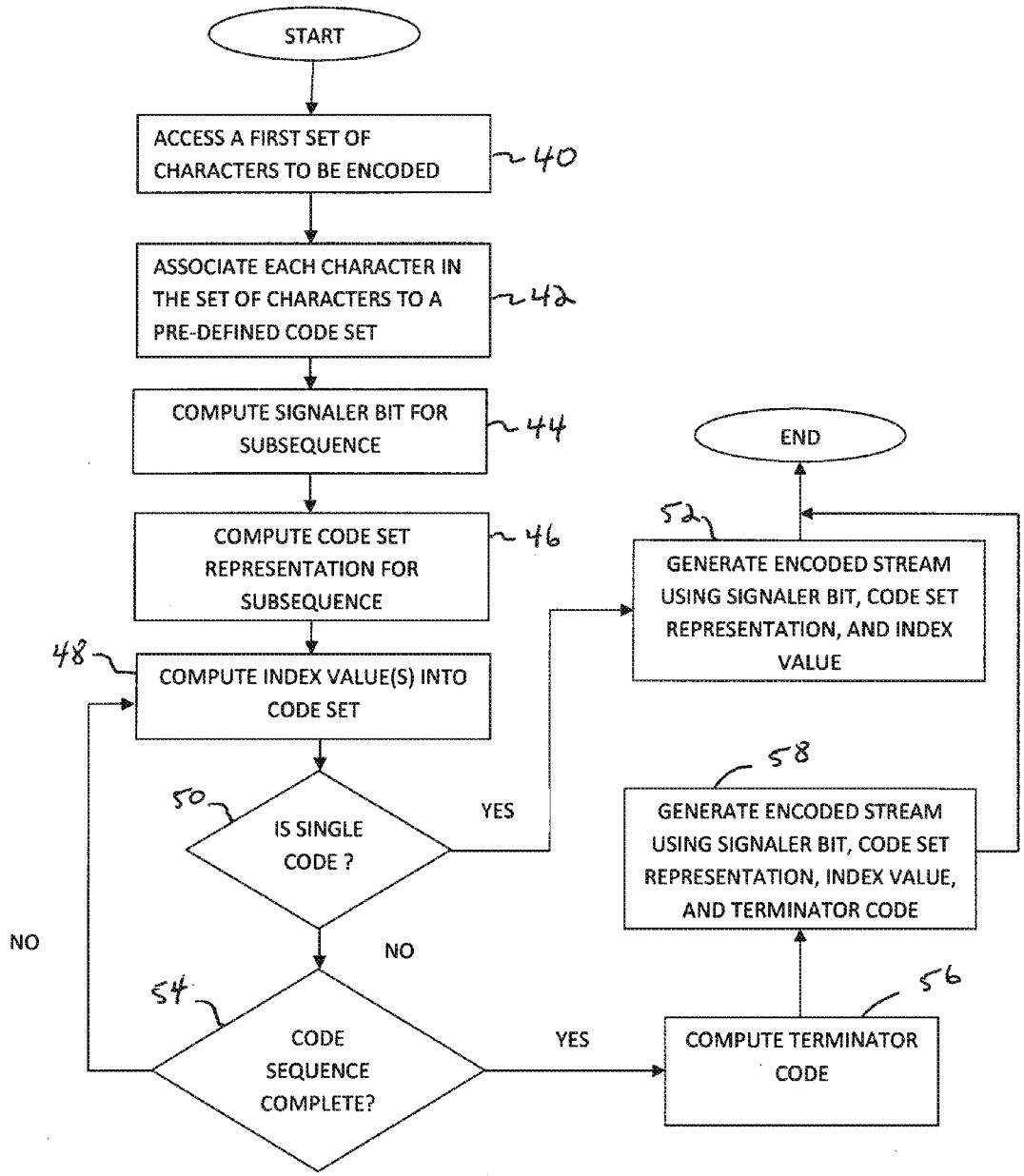
FIG. 2 illustrates an exemplary method of encoding sequences of characters.

Turning now to FIG. 2, a method executed by the encoder module 24 to encode a sequence of characters into an encoded stream is disclosed. As shown in FIG. 2, at step 40, the encoder module 24 first accesses a set of characters to be encoded. In one embodiment, the set of characters is received at the server device 12 as unencoded data 32A over the network 34. Next, at step 42, the encoder module associates each character in the set of characters to one of the code sets previously defined by the encoder module 24. Next, at step 44, the encoder module 24 computes a signaler bit for a subsequence of characters in the sequence of characters to be encoded. Every subsequence of characters generated in the encoded stream begins with a single signaler bit. In one embodiment, the encoder module 24 sets a bit value of zero (0) in the encoded stream to indicate the beginning of a multi-code sequence and a bit value of one (1) to indicate the beginning of a single-code sequence. Details of generating a multi-code sequence and single-code sequence are discussed below.

Next, at step 46, the encoder module 24 determines a code set representation for the encoded subsequence. In one embodiment, the encoder module 24 follows the signaler bit by a representation of the code set with which the next code in the character sequence is associated.

Example code sets representing the universe of printable ASCII characters, ninety-five (95) codes in all, are shown in FIG. 4. As shown in the FIG. 4 example, the encoder module 24 organized the ninety-five (95) codes into four (4) code sets 76A-D each requiring two bits to signal each code set (e.g., bits '00' representing code set zero (0), bits '01' representing code set one (1), bits '10' representing code set two (2), and bits '11' represent code set three (3)). The choice of this particular division (i.e., four (4) code sets) by the encoder module 24 may be based on an analysis of a specific type of data transmitted electronically when financial systems communicate. Within financial systems, typically there are numbers (code set 3), all capital identifiers (code set 0), and all lowercase identifiers (code set 1). By recognizing this pattern, the division into these code sets meets the heuristic, and achieves advantageous compression. Of course, as will be appreciated by one skilled in the art, an examination of different universes of data may identify other divisions more suitable for achieving the heuristic.

Referring back to FIG. 2, once the code set representation for a subsequence is computed, at step 48, the encoder module 24 computes index values into the respective code set. In one embodiment, an individual code within each code set is represented by the minimum number of bits required to express its index within the code set. For example, referring back to FIG. 4, the first code set 76A contains thirty one (31) codes, requiring five bits for expression of any index. Thus, five (5) 0 bits '00000' signal the first index, or 'A'. Similarly, the bits '00111', when used in conjunction with the first code set 76A, relate to the seventh index, or 'G'. By contrast, the third code set 76C contains only eleven codes (11), requiring four (4) bits for expression. As such, the first index of the third code set 76C, or '0', is expressible as four (4) 0 bits '0000'.

Next, at step 50, the encoder module 24 determines whether a single code sequence is to be generated. In one embodiment, the encoder module 24 determines whether a single code sequence is to be completed based on the value of the signaler bit. If the signaler bit value is one (1), a single-code sequence is determined and the subsequence expression is complete. The next bit will be a new signaler bit. Lastly, at step 52, the encoder module 24 generates the encoded stream by concatenating the computed signaler bit, code set representation, and index value.

Otherwise, at step 54, if the signaler bit value is zero (0), the encoder module 24 determines that a multiple-code sequence is to be generated and whether an additional code sequence is to follow. If an additional code sequence is to follow, at step 48, the encoder module 24 computes the next index value into the respective code set, bypasses step 50 and proceeds to step 54. If the code sequence is complete, at step 56, the encoder module 24 generates a terminator code for the subsequence and at step 58, generates the encoded subsequence using the computed signaler bit, code set representation, index value and terminator code.

In one embodiment, the terminator code is an implicit final code in each code set. For example, referring to the example code set (0) 76A in FIG. 4 which contains thirty-one (31) codes, the thirty-second (32) code is the terminator code, expressible as five bits of one (11111). In one embodiment, the encoder module 24 computes the terminator code for a code set as a series of 1-bits the length of which is equivalent to the expression of any code in the code set. The length of a code set is computed by the encoder module 24 to be one longer than the number of codes within the set.

As the terminator code requires bits for its expression, it is generally inefficient to express a single code as a multiple-code subsequence (signaler bit, code set, code bits, terminator bits) when it could be expressed as a single-code subsequence (signaler bit, code set, code bits). Thus, the encoder module 24 does not encode a multiple-code subsequence until it crosses a point of efficiency, hereinafter referred to as a 'tipping point', which may be variable based on the number of bits required to express a code, and the number of bits required to express a code set. In most instances, the tipping point at which it is more efficient to express a code in one multiple-code subsequence is very low.

FIG. 5 illustrates example points of efficiency 80 associated with the encoding method shown in FIG. 2. In one embodiment, the encoder module 24 expresses sequences of codes as either several one-code subsequences or one multiple-code subsequence depending upon the code set signaler length and code length. For example, in one embodiment as shown in FIG. 5, the encoder module 24 represents a minimum of two (2) sequential codes as one multiple-code subsequence instead of two (2) one-code sequences when the code set signaler length in bits associated with the sequential codes is one (1) and the code length in bits is one (1), as five (5) bits instead of six (6) bits may be utilized to express the sequential codes as one multiple-code sequence.

Similarly, considering a code set signaler length in bits of two (2) and a code length in bits of three (3), the minimum number of sequential codes used by the encoder module 24 to express one multiple-code subsequence instead of several one-code subsequences is three (3), as fifteen (15) bits instead of eighteen (18) bits may be utilized to express the sequential codes as one multiple-code sequence.

FIG. 6 illustrates an example worksheet 90 showing points of efficiency associated with the example code set three (3) 76D (4 bit codes) shown in FIG. 4. As shown in the FIG. 6 example, in one embodiment, the encoder module 24 expresses sequential codes as one multiple code sequence once the number of bits required to express single-code subsequences exceeds that of multiple-code subsequences. In the example shown in FIG. 6, once the number of sequential codes in the same code set is three (3), the encoder module 34 encodes one multiple-code subsequence that utilizes nineteen (19) bits instead of three (3) separate single-code subsequences requiring twenty-one (21) bits. FIG. 7 illustrates an example worksheet 100 showing points of efficiency associated with five (5) bit codes (e.g., example code set zero (0) 76A, code set one (1) 76B, and code set two (2) 76C.

As such, the encoder module 24 computes the tipping point based on the crossing point of the following two values: encoding in single-code subsequences (number of sequential codes*(1+code set signaler length+code length)); and encoding in one multiple-code subsequence ((1+number of sequential codes)*code length+1+code set signaler length). In one embodiment, for example, the encoder module 24 determines whether is it more efficient to use a multiple code-set subsequence rather than a single-code subsequence using the following algorithm:

$$N*(1+C+L)>(1+N)*L+C$$

where
N=the length of sequential codes in the same subsequence,
C=the number of bits in the code set signaler,
L=the number of bits in a code.

Using the before-mentioned techniques, optimal compression is achievable when all codes in a sequence are in the same code set. For example, referring to the example code sets of FIG. 4, sequential codes in code set three (3) may be expressed in forty-nine percent (49%) fewer bits than full ASCII encoding. Even for sequences as short as thirty-two (32) codes, the above-described techniques may achieve forty-seven percent (47%) compression for code set three (3), or thirty-four percent (34%) compression for any other code set, compared to full ASCII representation.

While the applicability of the techniques disclosed herein is broad and across computer science, FIGS. 8 and 9 illustrate two (2) examples selected from the field of financial trading, and in particular, from real-world order reference identifiers passed between market data providers and their consumers within Financial Information eXchange ('FIX') messages. As many market data providers have adopted FIX for their messaging schemes, and, as market data volume increases, the bandwidth required for market data has also increased, and compression of FIX messages is necessary and growing. Further, as market data is a real-time commodity, the value of market data decreases in value based on the amount of time required to decode, thus the techniques disclosed herein are applicable in areas in which speed of encoding and decoding is extremely important.

With reference to FIGS. 4 and 8, a first example of encoding by the encoder module 24 is shown. As shown in the FIG. 8 example, in one embodiment, the encoder module 24 encodes the first seven (7) codes 'GBP/CHF' 102A of sample unencoded data 102 using one multiple-code sequence requiring 43 bits (1-bit signaler, 2-bit code set, 7*5-bit code (28), 5-bit terminator). The bit stream associated with these seven characters is 1-00-00110-00010-01111-11011-00010-00111-001010-11111 wherein a "-" is used to separate the fields described in the parenthetical of the previous sentence for readability purposes and the character "A" is represented by "00000". The encoder module 24 then encodes the next two characters "##" 102B of the unencoded data 102 as two one-code sets requiring 16 bits. Once encoding of the unencoded data 102 is complete, the encoded sequence utilizes one-hundred and thirty one (131) bits resulting in an eighteen percent (18%) compression. In comparison, applying a standard JAVA zip library to the unencoded data 102 produces a compressed size of twenty six (26) bytes, which is more inefficient than the uncompressed encoding of the original twenty (20) bytes of unencoded data 102.

With reference to FIGS. 4 and 9, a second example of encoding by the encoder module 24 is shown. Similar to the example shown in FIG. 8, the encoder module 24 associates each code in the unencoded data 104 to one of the code sets and computes the number of bits needed to express each subsequence. Once encoding of the unencoded data 104 is complete, the encoded sequence utilizes a total of two-hundred and fifty two (252) bits resulting in a thirty six percent (36%) compression. In comparison, applying a standard JAVA zip library to the unencoded data 104 produces a compressed size of fifty-six (56) bytes, which again is more inefficient than the uncompressed encoding of forty-nine (49) bytes for the unencoded data 104.

The data examples shown in FIGS. 8 and 9 utilized a binary expression of the index of a code within a code set. For example, example the third code set 76C shown in FIG. 4, which contained eleven (11) codes plus the terminator code, or twelve (12) codes total, utilizes four (4) bits per code within the set, as four (4) binary bits can represent up to sixteen (16) different values, from 0000 to 1111. Thus, in the example shown in FIG. 9, thirty-two (32) sequential numerical codes may be represented in one-hundred and thirty-five (135) bits, with one-hundred and twenty eight (128) code bits, four (4) terminator bits, plus a header of one (1) signaler bit and two (2) code set bits.

In another embodiment, however, these thirty-two (32) codes may be represented as a sequence of numbers, in base-32, and then encoded in binary. This embodiment would result in one-hundred and four (104) bits being required to express the thirty-two (32) codes and the signaler code, yielding one-hundred and five (105) bits total, or an additional twenty percent (20%) compression vs. the binary representation of the same subsequence. This compression is achievable as binary representation is more efficient around expressions of powers of two (2), whereas base-12 is more efficient around expressions with twelve (12) possible values for each position.

Accordingly, the disclosed techniques may be utilized to express codes (and code sets) in base-required-length numbers which are then encoded in binary, rather than being expressed in pure binary. Further, it is worthwhile to note the tradeoff between computational complexity (i.e., speed of encoding and decoding) and quality of compression. That is, one embodiment may emphasize computational speed over compression quality and choose a pure binary expression of the encoded sequences, whereas another embodiment may emphasize compression quality over computational speed may select a base-code-set-length expression of a code.

Additional variations of the above-described encoding technique may also be implemented. For example, in one embodiment, the encoding technique for multiple-code sets is represented as signaler bit, code set bits, multiple codes, and terminator code. In another embodiment, the encoding technique defines multiple code sets as signaler bit, code set bits, fixed-length-prefix determining the number of codes, and multiple codes. The latter embodiment may be advantageous when the number of bits required to express a code exceeds the typical number of codes found in the same subsequence.

For example, if twenty (20) bits are used to express a code, but subsequences are rarely longer than sixteen (16) successive codes, a 4-bit prefix, as opposed to a 20-bit suffix, would be advantageous. Further, the use of this length-first prefix may be mixed with the use of a terminator suffix code. An encoder/decoder pair may make the determination per code set, whether to include a terminator code, or use a prefix, with a different length prefix for each code set.

Figure 3:
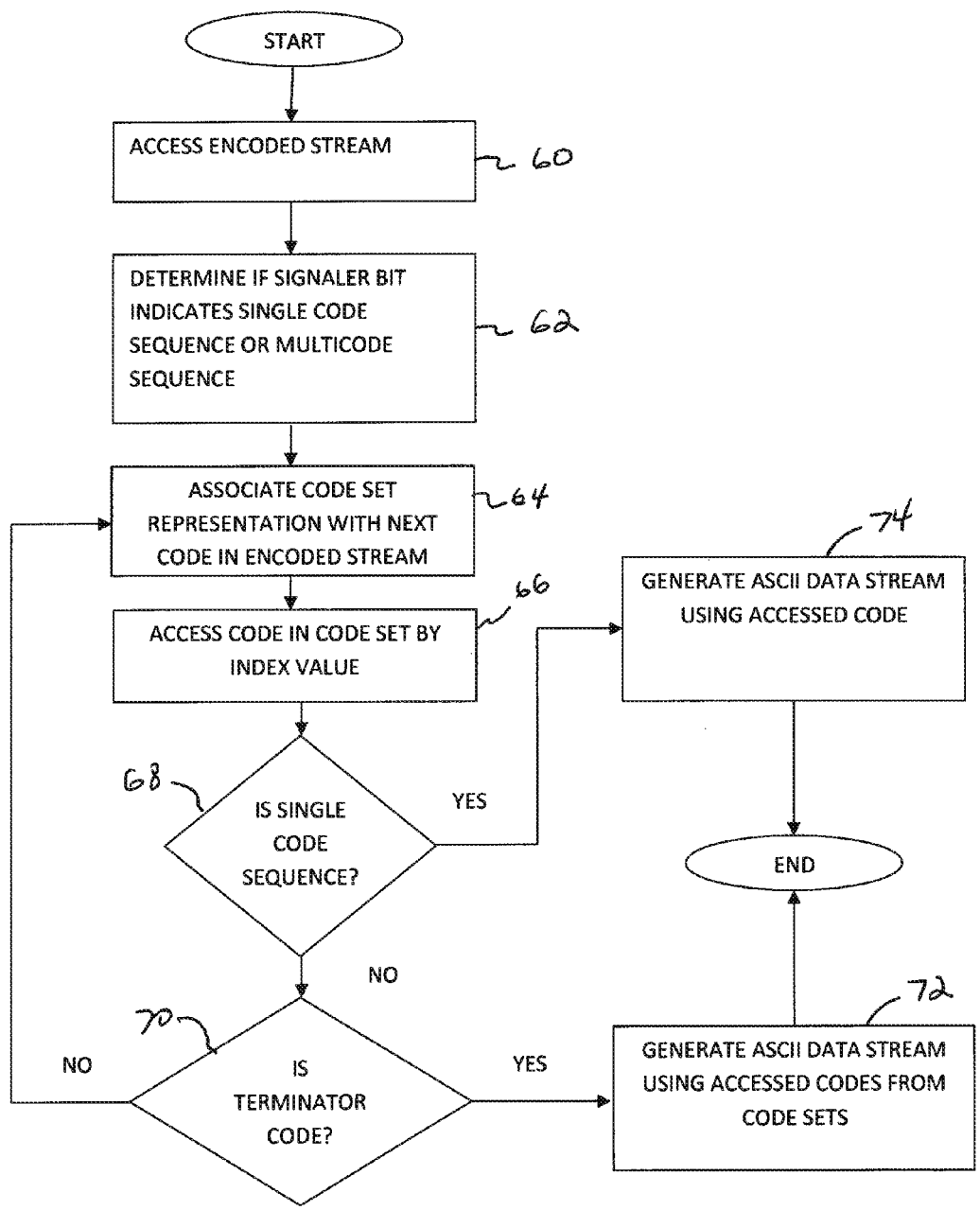
FIG. 3 illustrates an exemplary method of decoding encoded sequences of characters.

Turning now to FIG. 3, a method executed by the decoder module 26 to decode encoded sequences of characters is disclosed. As shown in FIG. 3, at step 60, the decoder module 26 accesses an encoded data stream. Next, at step 62, the decoder module 26 determines if the signaler bit included in the encoded stream indicates a single-code sequence or multi-code sequence and, at step 64, the decoder module 26 associates a code set representation with the next code in the encoded stream.

Once a code set representation is associated, at step 66, the decoder module 26 accesses a code in the code set based on the index value included in the encoded stream. Next, at step 68, the decoder module 26 determines if the encoded stream is a single-code sequence based on the signaler bit. If the encoded stream is a single-code sequence, at step 74, the decoder module 26 generates an ASCII data stream using the accessed code from step 66. Otherwise, at step 70, the decoder module 26 determines whether the code being analyzed in the encoded stream is a terminator code. If the code being analyzed is a terminator code, at step 72, the decoder module 26 generates the ASCII data stream using the accessed codes from the code sets. Otherwise, the decoder module 26 repeats steps 64-66 and 70 until the terminator code is determined and then, at step 72, generates the ASCII data stream from the encoded stream using accessed codes from code sets.

Various features of the system may be implemented in hardware, software, or a combination of hardware and software. For example, some features of the system may be implemented in one or more computer programs executing on programmable computers. Each program may be implemented in a high level procedural or object-oriented programming language to communicate with a computer system or other machine. Furthermore, each such computer program may be stored on a storage medium such as read-only-memory (ROM) readable by a general or special purpose programmable computer or processor, for configuring and operating the computer to perform the functions described above.

What is claimed is:
1. A computer-implemented method of encoding a sequence of characters comprising:
 accessing, from a computer device, a set of characters conforming to a first format;
 associating, at the computer device, one of a plurality of code subsets to each of the set of characters; and generating, at the computer device, a code sequence representing the set of characters, the code sequence conforming to a second format using fewer bits than the first format, wherein the second format includes a first indicator for specifying a single-code sequence or a multi-code sequence, a second indicator for specifying the one of the plurality of code subsets associated with the set of characters, and a third indicator for specifying an index value into the one of the plurality of associated code subsets corresponding to the set of characters.

2. The method of claim 1, wherein the second format further comprises a fourth indicator for specifying an end position of the code sequence.

3. The method of claim 1, further comprising determining whether to generate the code sequence as a single-code sequence or a multi-code sequence.

4. The method of claim 1, further comprising associating each character of the set of characters with one of the plurality of code subsets.

5. A computer-implemented method of decoding a sequence of encoded characters comprising:
    accessing, from a computer device, a set of encoded characters conforming to a first format, the first format including a first indicator indicating whether the set of encoded characters is a single-code sequence or a multi-code sequence, a second indicator indicating one of a plurality of code subsets associated with the set of encoded characters, and a third indicator indicating an index value into one of the plurality of associated code subsets corresponding to the set of encoded characters; and
    generating, at the computer device, a sequence of unencoded characters conforming to a second format, the second format using more bits than the first format.

6. The method of claim 5, wherein the second format is an ASCII format.

7. The method of claim 5, wherein the first format further comprises a fourth indicator indicating an end position of the sequence of encoded characters.

8. A system comprising:
    a server including a processor and memory storing instructions that, in response to receiving a request for access to a service, cause the processor to:
    access, from the memory, a set of characters conforming to a first format;
    associate, in the memory, one of a plurality of code subsets to each of the set of characters;
    generate, at the server, a code sequence representing the set of characters, the code sequence in conformity with a second format using fewer bits than the first format, wherein the second format includes a first indicator to specify a single-code sequence or a multi-code sequence, a second indicator to specify the one of the plurality of code subsets associated with the set of characters, and a third indicator to specify an index value into the one of the plurality of associated code subsets corresponding to the set of characters;
    generate, at the server, a signal associated with the code sequence in conformity with the second format; and
    transmit the signal.

9. The system of claim 8, wherein the second format further comprises a fourth indicator for specifying an end position of the code sequence.

10. The system of claim 8, wherein the memory stores instructions that, in response to receiving the request, cause the processor to associate each character of the set of characters with one of the plurality of code subsets.

11. A system comprising:
    a server including a processor and memory storing instructions that, in response to receiving a request for access to a service, cause the processor to:
    access, from the memory, a set of encoded characters conforming to a first format, the first format including a first indicator indicating whether the set of encoded characters is a single-code sequence or a multi-code sequence, a second indicator indicating one of a plurality of code subsets associated with the set of encoded characters, and a third indicator indicating an index value into one of the plurality of associated code subsets corresponding to the set of encoded characters;
    generate, at the server, a sequence of unencoded characters conforming to a second format, the second format using more bits than the first format;
    generate, at the server, a signal associated with the sequence of unencoded characters in conformity with the second format; and
    transmit the signal.

12. The system of claim 11, wherein the second format is an ASCII format.

13. The system of claim 11, wherein the first format further comprises a fourth indicator indicating an end position of the sequence of encoded characters.

14. An article comprising a non-transitory machine-readable medium storing machine-readable instructions that, when applied to the machine, cause the machine to:
    access, on the machine, a set of characters conforming to a first format;
    associate, on the machine, one of a plurality of code subsets to each of the set of characters; and
    generate, on the machine, a code sequence representing the set of characters, the code sequence in conformity with a second format using fewer bits than the first format, wherein the second format includes a first indicator to specify a single-code sequence or a multi-code sequence, a second indicator to specify the one of the plurality of code subsets associated with the set of characters, and a third indicator to specify an index value into the one of the plurality of associated code subsets corresponding to the set of characters.

15. An article comprising a non-transitory machine-readable medium storing machine-readable instructions that, when applied to the machine, cause the machine to:
    access, on the machine, a set of encoded characters conforming to a first format, the first format including a first indicator indicating whether the set of encoded characters is a single-code sequence or a multi-code sequence, a second indicator indicating one of a plurality of code subsets associated with the set of encoded characters, and a third indicator indicating an index value into one of the plurality of associated code subsets corresponding to the set of encoded characters;
    generate, on the machine, a sequence of unencoded characters conforming to a second format, the second format using more bits than the first format.

16. A computing device comprising:
    a processor;
    a memory operatively coupled to the processor, the memory storing instructions that, in response to receiving a request, cause the processor to:
    access, using the memory, a set of characters conforming to a first format;
    associate, at the computing device, one of a plurality of code subsets to each of the set of characters; and generate, at the computing device, a code sequence representing the set of characters, the code sequence conforming to a second format using fewer bits than the first format, wherein the second format includes a first indicator for specifying a single-code sequence or a multi-code sequence, a second indicator for specifying the one of the plurality of code subsets associated with the set of characters, and a third indicator for specifying an index value into the one of the plurality of associated code subsets corresponding to the set of characters.

* * * * *